United States Patent [19]
Shields et al.

[11] Patent Number: 5,397,607
[45] Date of Patent: Mar. 14, 1995

[54] INPUT/OUTPUT (I/O) THIN FILM REPAIR PROCESS

[75] Inventors: Ronald R. Shields; Kurt A. Smith, both of Dutchess County; Ronald J. McDonald, Ulster County, all of N.J.

[73] Assignee: International Business Machines Corporation, Armonk, N.Y.

[21] Appl. No.: 243,898

[22] Filed: May 17, 1994

[51] Int. Cl.⁶ ............................................. B05D 1/36
[52] U.S. Cl. ................................. 427/555; 427/250; 427/264; 427/272; 427/282; 427/289
[58] Field of Search ............... 427/555, 250, 264, 272, 427/282, 289

[56] References Cited

U.S. PATENT DOCUMENTS

| | | | |
|---|---|---|---|
| 4,438,561 | 3/1984 | Mueller | 29/831 |
| 4,636,403 | 1/1987 | Fisanick et al. | 427/53.1 |
| 4,704,304 | 11/1987 | Amendola et al. | 427/57 |
| 4,950,498 | 8/1990 | Kaito | 427/38 |
| 5,077,891 | 1/1992 | Lychyk et al. | 29/847 |
| 5,079,070 | 1/1992 | Chalco et al. | 428/209 |

Primary Examiner—Bernard Pianalto
Attorney, Agent, or Firm—Whitham, Curtis, Whitham & McGinn

[57] ABSTRACT

Missing thin film metallurgy on substrates is replaced during the manufacture of thin film electronic circuits. The process allows the missing thin film metallurgy, such as an input/output (I/O) pad or pads, to be replaced quickly and simply, without damaging the other I/O pads or thin film metallurgy already applied to the substrate. The process essentially uses lift-off technology without building a complete lift-off stencil.

5 Claims, 3 Drawing Sheets

INPUT/OUTPUT (I/O) THIN FILM REPAIR PROCESS

BACKGROUND OF THE INVENTION

1. Field of the Invention

The present invention generally relates to the manufacture of thin film electronic circuits on substrates and, more particularly, to a process of replacing missing thin film metallurgy, such as missing input/output (I/O) pads, in an efficient and inexpensive manner.

2. Description of the Prior Art

Missing input/output (I/O) pads on substrates, even if only one, can result in the substrate being scrapped. In the manufacture of certain electronic circuits, I/O pads are formed using thin film metallurgy by, for example, evaporating chromium (Cr), nickel (Ni) and gold (Au) I/O pads directly on a substrate through a metal mask. The thicknesses of the components in the thin film metallurgy is typically in the micron range. Substrates manufactured using this process may exhibit one or more missing I/O pads. Some of these missing I/O pads are electrically acceptable because of redundancy, others are not. If the I/O were critical, the part would have to be scraped for electrical reasons. Since I/O pads are often deposited well into the thin film process, the loss of the part can have a serious impact on manufacturing schedules and costs.

SUMMARY OF THE INVENTION

It is therefore an object of the present invention to provide a way to replace missing thin film metallurgy on substrates during the manufacture of thin film electronic circuits.

According to the invention, a process has been developed that allows the missing thin film metallurgy, such as an I/O pad or pads, to be replaced quickly and simply, without damaging the other I/O pads or thin film metallurgy already applied to the substrate. The process essentially uses lift-off technology but without having to build a complete lift-off stencil which is both time consuming and expensive.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
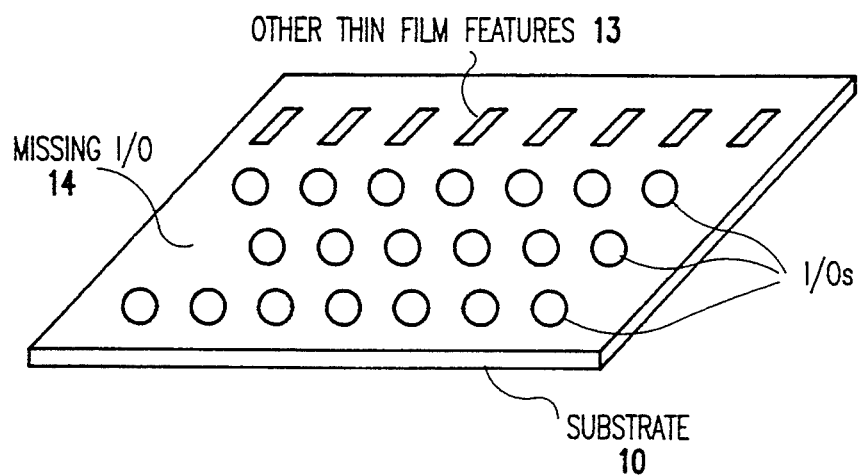
FIG. 1 is an isometric view of a glass ceramic substrate showing a missing I/O pad.
Figure 2:
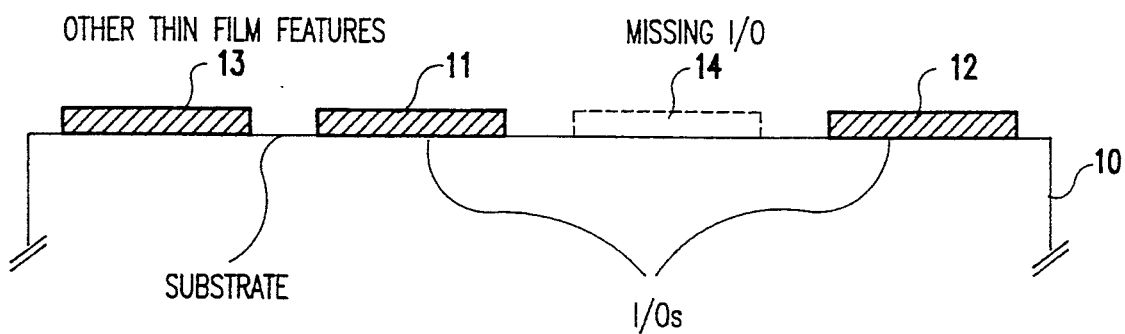
FIG. 2 is a side view of a glass ceramic substrate showing a missing I/O pad.

Referring now to the drawings, and more particularly to FIGS. 1 and 2, there is shown in isometric view and side view, respectively, a substrate 10 having a plurality of I/O pads 11 and 12, as well as other thin film (TF) features 13. FIG. 2 illustrates by dotted line a missing I/O pad 14. The process according to the invention builds a replacement for the missing I/O pad 14.

Figure 3:
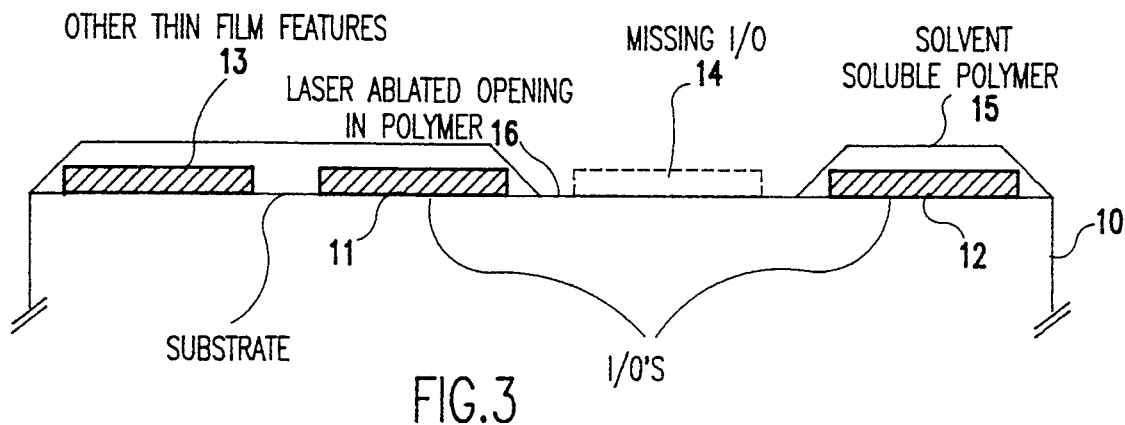
FIG. 3 is a side view similar to FIG. 2 showing the substrate with an overcoat of a soluble polymer having an ablated opening in the vicinity of the missing I/O pad.

In Step 1, the substrate is overcoated with soluble polymer 15 to approximately twice the thickness of the feature to be replaced, as shown in FIG. 3. The soluble polymer may be any polymer soluble in an organic solvent and which absorbs laser radiation. Polymers which meet these specifications include polyimides, polyquinoxalines, polyquinolines, and polybenzimidazoles. This overcoat is a metal protection layer and creates a base for a stencil.

In Step 2, a laser beam, which is not shown in the figures, is moved to the location of the missing I/O pad under program control, and the polymer overcoat is laser ablated at that site to form an ablated opening 16 at the site. The ablated opening is made slightly larger than the I/O pad dimension (e.g., 2.1 mm for a 1.9 mm pad).

Figure 4:
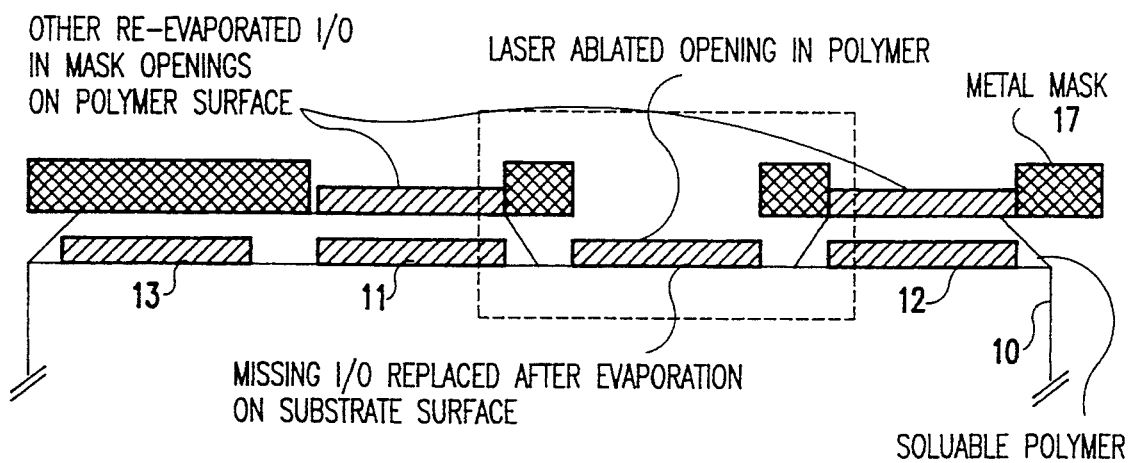
FIG. 4 is a side view similar to FIG. 3 showing the addition of the missing I/O pad by an evaporation process.

In Step 3, the substrate is next ashed and ion beamed and the original metal I/O mask 17 is remounted, as shown in FIG. 4, and metal is evaporated again as in the original application of the I/O pads. It will be observed that metal is deposited not only in the location of the missing I/O pad 14, but also in the locations of the I/O pads 11 and 12; however, in the case of the latter, the evaporated metal is deposited on the soluble polymer.

Figure 4A:
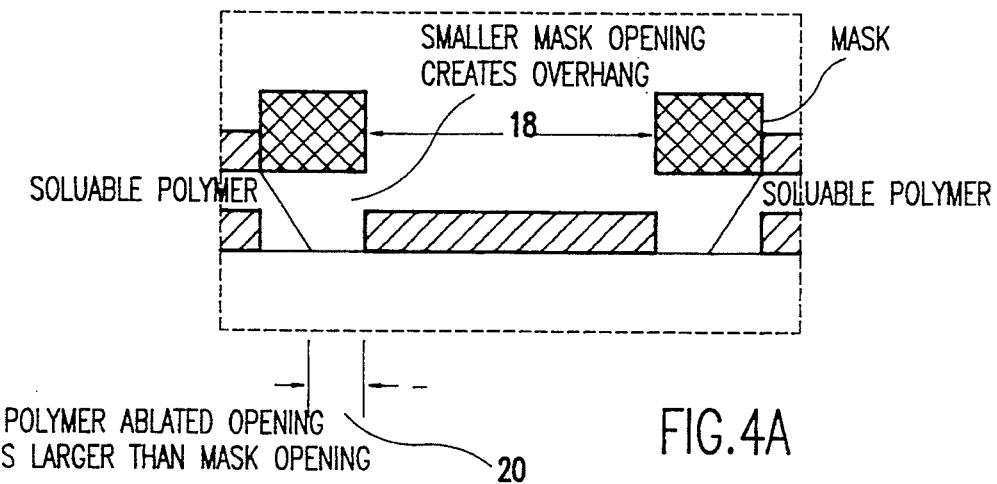
FIG. 4A is an enlarged side view showing in greater detail the relative size of the ablated opening and the mask opening.

The I/O openings in the metal mask for the specific example given is 1.9 mm, although they could be larger or smaller depending on the particular application. It is the difference 20 between the metal mask opening 18 and the laser ablated opening 16 that creates the critical overhang necessary during metal evaporation, as shown in more detail in FIG. 4A.

Figure 5:
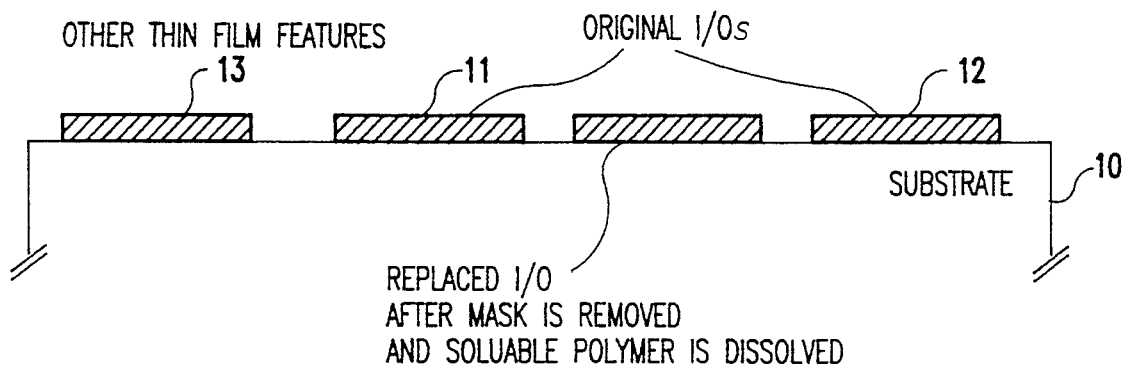
FIG. 5 is a side view similar to FIG. 4 showing the removal of the mask and the replaced I/O pad.
Figure 6:
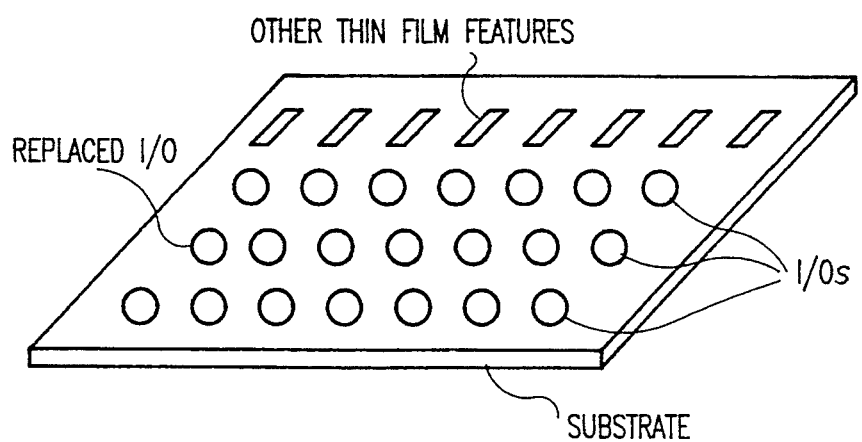
FIG. 6 is an isometric view similar to FIG. 1 showing the replaced I/O pad.

In Step 4, the soluble polymer overcoat is removed in NMP or some other suitable solvent and the substrate dried. All missing I/O pads have now been replaced as shown in FIGS. 5 and 6, and the substrate can continue with further thin film processing steps.

The process described is a faster, simpler and less expensive technique than if a complete stencil were built to replace the missing I/O pad. The reactive ion etch (RIE) barrier application, photoresist application, photo exposure and RIE processing to create an overhang in the conventional process are all eliminated.

It will be understood by those skilled in the art that the invention can be used to replace more than one I/O pad, the example described being simplified to promote an understanding of the invention. Further, the invention is not limited to replacement of I/O pads but may be extended to the replacement of missing thin film metallurgy in general. Thus, while the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of repairing missing thin film metallurgy on a substrate comprising the steps of:

(a) locating a portion of the substrate where the thin film metallurgy is missing;
(b) covering the substrate and the portion in (a) with a layer of soluble polymeric material;
(c) ablating the polymeric material at the missing portion so as to create an opening in the polymeric material of a first dimension;
(d) placing a mask over the polymeric material, said mask having perforations smaller in size than the first dimension and with one perforation being in alignment with the opening in the polymeric material;
(e) depositing metal through said perforations and into the opening of the polymeric material so as to replace the missing portion of thin film metallurgy; and
(f) removing the mask and layer of soluble polymeric material.

2. The method of repairing missing thin film metallurgy on a substrate as recited in claim 1 wherein the step of ablating the polymeric material is performed with a laser.

3. The method of repairing missing thin film metallurgy on a substrate as recited in claim 1 wherein the step of placing a mask over the polymeric material is performed using an original mask the perforations of which were used to form the thin film metallurgy on the substrate.

4. The method of claim 1 wherein said soluble polymeric material is soluble in an organic solvent and absorbs laser radiation.

5. The method of claim 4 wherein said soluble polymeric material is selected from the group consisting of polyimides, polyquinoxalines, polyquinolines, and polybenzimidazoles.

* * * * *